United States Patent
Chen et al.

(10) Patent No.: US 7,034,411 B2
(45) Date of Patent: Apr. 25, 2006

(54) APPLICATION OF LOW-TEMPERATURE AND SOLID-STATE PYROELECTRIC ENERGY CONVERTER

(75) Inventors: Wen-Pin Chen, Taipei (TW); Naiying Jean, Taipei (TW)

(73) Assignee: Chiu-Yueh TUNG, HsinTien, Taipei (TW)

( * ) Notice: Subject to any disclaimer, the term of this patent is extended or adjusted under 35 U.S.C. 154(b) by 0 days.

(21) Appl. No.: 10/852,229

(22) Filed: May 25, 2004

(65) Prior Publication Data

US 2004/0251690 A1    Dec. 16, 2004

(30) Foreign Application Priority Data

Jun. 12, 2003    (TW) .............................. 092116023 U (51) Int. Cl.
    *H02N 3/00*    (2006.01)
(52) U.S. Cl. ...................................... 290/1 R; 136/205
(58) Field of Classification Search ................ 290/1 R; 136/201, 205, 206
    See application file for complete search history.

(56) References Cited

U.S. PATENT DOCUMENTS

| | | | | |
|---|---|---|---|---|
| 2,886,618 A | * | 5/1959 | Julian ......................... | 136/204 |
| 3,081,362 A | * | 3/1963 | Henderson et al. ......... | 136/201 |
| 3,127,287 A | * | 3/1964 | Henderson et al. ......... | 136/201 |

(Continued)

FOREIGN PATENT DOCUMENTS

| | | | |
|---|---|---|---|
| DE | 4208358 A1 | * | 9/1993 |
| EP | 539151 A1 | * | 4/1993 |
| EP | 1195799 A1 | * | 4/2002 |
| JP | 07082022 A | * | 3/1995 |
| JP | 200073754 A | * | 3/2000 |

(Continued)

*Primary Examiner*—Waks Joseph
(74) *Attorney, Agent, or Firm*—Troxell Law Office, PLLC (57) ABSTRACT

An application of low-temperature and solid-state pyroelectric energy converter for converting heat produced from low-temperature operations into electric energy, which utilizes man-made waste heat or waste heat from natural environments for producing changes in materials of specific lattice structures, so as to result potential difference caused anisotropy displacement of centers of positive charges and negative charges along directions of polar axes of the lattices, thereby converting heat energy into electric energy. The application is entirely implemented in an environment having a heat source, and thermal energy is continuously converted into electric energy. Therefore, in order to accomplish energy recycling and energy assisting purposes, the application can be extensively applied in appliances or equipments that produce waste thermal energy. In addition, the application can be expanded with respect to size and range to further replace assistant generator applications such as conventional mechanical/electrical generator.

5 Claims, 14 Drawing Sheets

U.S. PATENT DOCUMENTS

| | | | | |
|---|---|---|---|---|
| 3,130,084 | A | * | 4/1964 | Loring .................. 136/206 |
| 3,641,346 | A | * | 2/1972 | Lachambre .............. 374/32 |
| 4,004,210 | A | * | 1/1977 | Yater .................... 322/2 R |
| 4,327,153 | A | * | 4/1982 | Micheron ............... 428/421 |
| 4,443,650 | A | * | 4/1984 | Takagi et al. .......... 136/211 |
| 4,647,836 | A | * | 3/1987 | Olsen .................... 322/2 A |
| 4,820,586 | A | * | 4/1989 | Krueger et al. ........ 428/421 |
| 5,228,923 | A | * | 7/1993 | Hed ...................... 136/208 |
| 5,376,184 | A | * | 12/1994 | Aspden ................. 136/203 |
| 5,430,322 | A | * | 7/1995 | Koyanagi et al. ...... 257/467 |
| 5,470,395 | A | * | 11/1995 | Yater et al. ............ 136/203 |
| 5,644,184 | A | * | 7/1997 | Kucherov .............. 310/306 |
| 5,653,954 | A | * | 8/1997 | Rosen et al. ........... 423/594.4 |
| 6,480,366 | B1 | * | 11/2002 | Cordaro ................ 361/15 |
| 6,593,666 | B1 | * | 7/2003 | Pinkerton .............. 290/1 R |
| 6,717,043 | B1 | * | 4/2004 | Hasegawa et al. ..... 136/205 |
| 2004/0214723 | A1 | * | 10/2004 | Nonoyama et al. .... 505/100 |

FOREIGN PATENT DOCUMENTS

| | | |
|---|---|---|
| TW | 891276 35 | 12/1989 |
| TW | 90129981 | 12/1990 |

* cited by examiner

FIG.10

APPLICATION OF LOW-TEMPERATURE AND SOLID-STATE PYROELECTRIC ENERGY CONVERTER

BACKGROUND OF THE INVENTION (a) Field of the Invention

The invention relates to an application of a low-temperature and solid-state pyroelectric energy converter, and more particularly, to an application of a solid-state and ceramic pyroelectric energy conversion for producing electric currents when entirely located in a heated environment. Without requiring designs of cooling devices, the application of a solid-state and ceramic pyroelectric energy converter may be entirely dipped into heat, and is suitable for circumstances where heat sources ranging from low heat to high heat are present.

(b) Description of the Prior Art

For an apparatus that produces waste heat such as thermal energy generated by a center processing unit (CPU) or chipsets of a computer, it is necessary to cool the thermal energy accumulated. A fan acquiring power supply from a host of the computer is generally used as a heat dissipation device for cooling down the CPU. There are more advanced cooling methods for cooling down chips. However, these more advanced methods need extremely large power and thus consume significant electric energy, and can hardly be extensively implemented. In recent pyroelectric elements of cooling pyroelectric devices referred by the Taiwan Patent No. 90129981, "Cooling Points of High-Efficiency Cooler for Pyroelectricity", and Taiwan Patent No. 89127635, "Method for Making a Plurality of Element Chips Using Sheets Made of Pyroelectric Materials", cooler structures for heat sinks are required. Operation outcomes of these coolers are similarly followed by formation of waste heat that demands additional energy for external cooling. To be more precise, two basic operating modes namely hot and cold surroundings are needed as operating conditions of the coolers. The invention comprises a generator element that can be entirely placed in a heated environment, for example, warm water or any gaseous environment having heat conditions. Operating energy foundations can then be derived and substantial electricity can be generated using a temperature of about 55° C.

As algorithmic speed of CPUs progresses, thermal energy produced correspondingly sum up to significant amounts. Take an Intel Pentium4 CPU for example, thermal energy produced by 1 GHz can reach as high as above 50 W, not to mention that thermal energy produced by 2 or 3 GHz CPUs can even get more than 80 W. The same difficulty has also arisen in communication and optoelectronics industries. In the wake of flourishing of electronic communications and overwhelming numbers of users, demands of forced cooling effects are evidently multiplying. Therefore, it is reversely inferred from such demands that requirements of sources of power needed are greatly expanded, and accumulated waste heat to be eliminated becomes quite large as well. Thus, supposed a design of close loops can be applied in the aforesaid electronic appliances without requiring external electric power for assisting cooling, to be more specific, if waste heat produced by these electronic systems can directly be converted into electric power to generate electricity for activating cooling fans for further accomplishing self-cooling effects, this design is certainly to be a novel realm of current related equipments.

According to statistics by Taiwan Institute of Information Industry dated September 2002, volumes of desktop PCs would reach 105,655,000 and laptop computers would reach 30,003,000 in the year 2002. Provided that cooling fans of each computer need around 3.5 W of power, energy needed for obtaining this heat dissipation purpose globally adds up to 476,000,000 W of electricity, which is approximately equal to a power plant with an output of 500,000 KW. It is apparent that if self-contained energy recycling and utilization can be thoroughly implemented without requiring external energy in the aforesaid electric devices, immense support would certainly be contributed toward global environment arid energy saving.

SUMMARY OF THE INVENTION

According to a principle of the invention, a ceramic material is utilized for continuously absorbing surrounding thermal energy for increasing temperature thereof. Meanwhile, phase-change is caused, wherein lattices react with respect to directions along polar axes, and anisotropy displacement takes placed at centers of positive charges and centers of negative charges. Thus, potential difference is resulted for continuously producing electric currents. This environmental-friendly and energy-saving application is a most cutting-edge implementation for that no thermal energy needs to be specifically produced by intrinsic quality of the ceramic material, and absolutely neither pollutions nor noises are resulted from engineering process thereof.

The generator element according to the invention is a ceramic material made of thermal conductive covalent ions. In addition, holes formed by non-covalent ions are employed for controlling conductivity, thereby accomplishing conversions of different energies.

BRIEF DESCRIPTION OF THE DRAWINGS

FIG. 1-1 shows a basic application diagram of a system.

FIG. 6-1 shows a diagram of an application embodiment according to the invention being applied outdoors.

FIG. 6-2 shows an application embodiment being operated using hot-dip according to the invention.

FIG. 7-1 shows a schematic view of illustrating recycling of body heat from an automobile according to the invention.

FIG. 9-1 shows an application schematic diagram illustrating steam/electricity co-generation according to the invention.

DETAILED DESCRIPTION OF THE PREFERRED EMBODIMENTS

To better understand the invention, detailed descriptions shall be given with the accompanying drawings hereunder.

Figure 1:
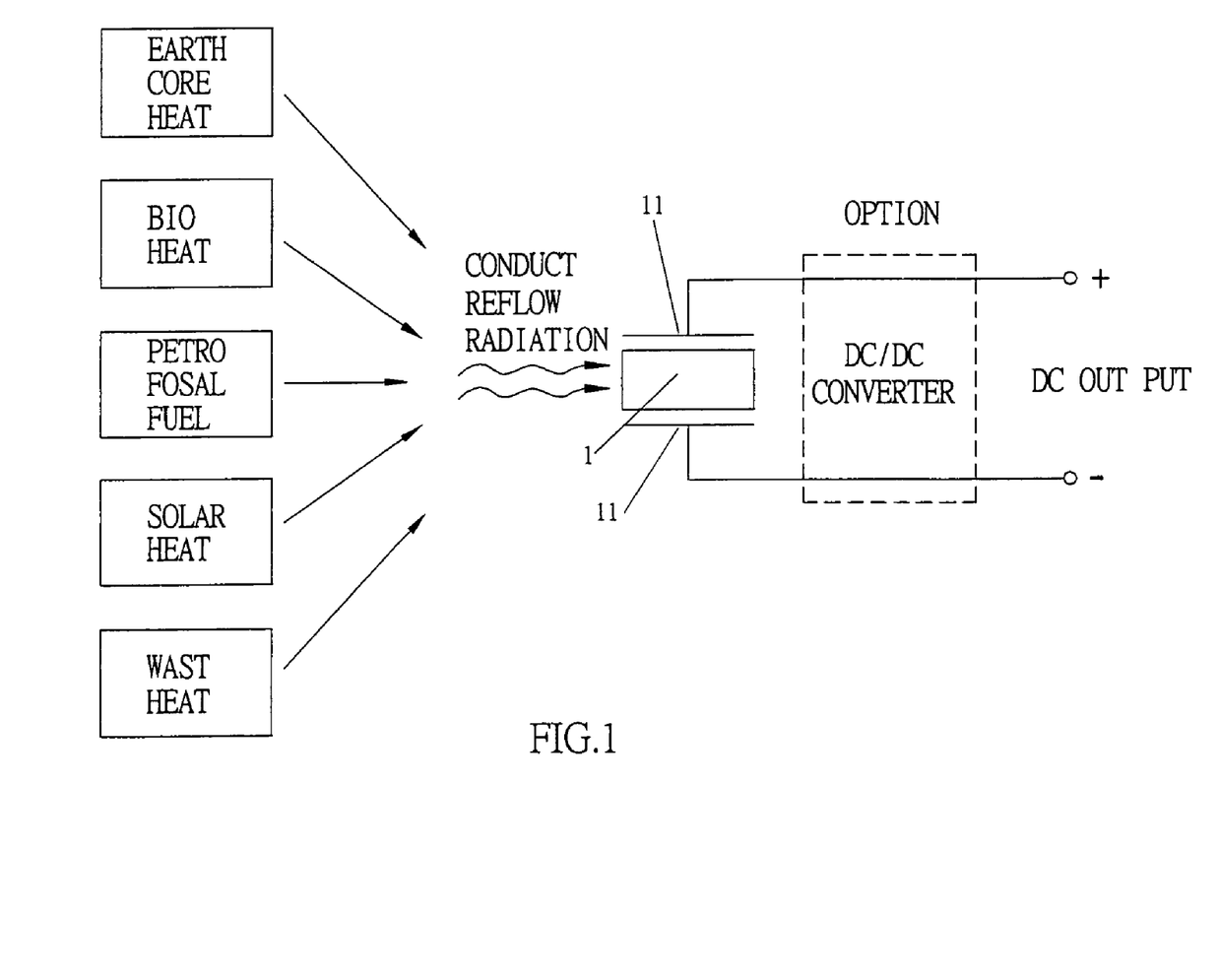
FIG. 1 shows a basic application diagram according to the invention.

Referring to FIG. 1 showing a fundamental application according to the invention, the invention comprises a chunk-like generator element 1, wherein a direct current is drained from positive and negative sides thereof via an electrically conductive coating 11, respectively. The generator element 1 is capable of producing certain pyroelectric converting effects by directly absorbing thermal energy from all kinds of environments through convection, conduction and radiation.

The operating principle is that pyroelectricty of ceramic is utilized as a foundation of direct conversion of thermal energy into electric energy. The pyroelectricity of ceramic is indicated by the following equation:

$$Epyro \equiv \frac{\alpha \cdot \Delta T}{k \cdot \varepsilon 0},$$

where Epyro is the electric field produced by pyroelectricity in Volt/m;
  $\alpha$ is the coefficient of pyroelectricity in coulomb/° C.;
  k is the dielectric constant;
  $\Delta T$ is the temperature change in a material caused by a heat source; and
  $\varepsilon_0$ is the vacuum capacitance in $m^{-1}$.

It is observed from the above equation that, the energy conversion rate of a ceramic material having pyroelectricity may be greater than 6%, which is already sufficient for industrial applications. In addition, utilization ratio of the ceramic material may be further elevated as material performance thereof advances.

Figure 11:
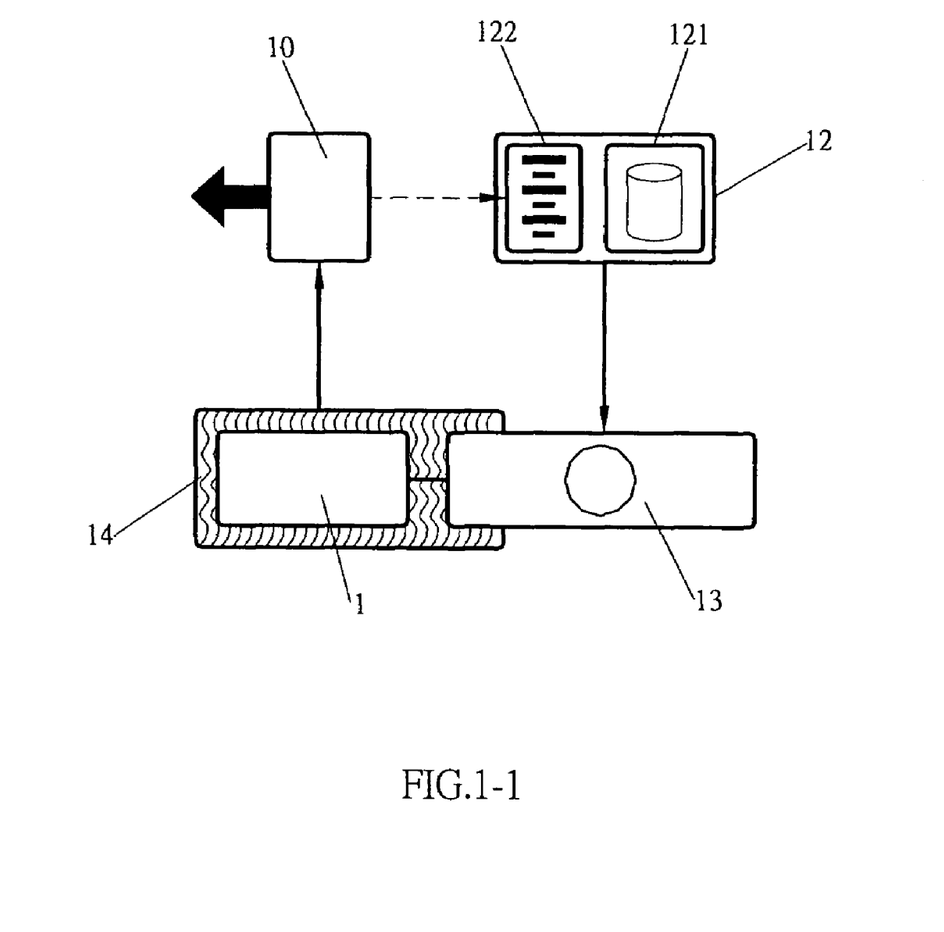

Referring to FIG. 1-1 showing an implementation foundation of application according to the invention, a carrier end 13, such as a motor, a CPU or an automobile engine, acquires forces from an energy source 12 and produces waste heat from operation efficiency thereof. The waste heat is collected or guided using a waste heat exchange element 14, such as a heat sink, and is transmitted to a generator element 1, which absorbs the thermal energy further converted to electric energy that is outputted through operations of the generator element 1. An output end then utilizes a direct-current conversion circuit 10 to convert the electric energy into steady and applicable electric energy. Using the aforesaid basic application, the invention can be extended to usages of circumstances having any kinds of thermal energy, including man-made heat sources like a heating system 121 that combusts gas 121, thereby accomplishing gas-electricity conversion and electricity generating purposes.

In case that the energy source 12 is an electric power source 122, waste heat produced by the carrier end 13 is converted into an electric current using the generator element 1 according to the aforesaid description. After having been processed by the conversion circuit 10, the current is directly fed back to the electric power source 122 and serves for direct energy recycling purposes, with at least assisting energy recycling according to performance of the aforesaid operation.

Referring to the diagram, to discharge waste heat produced by an apparatus such as a motor adopted by the carrier end 13, a waste heat exchanging element 14 is utilized to compel and discharge the waste heat produced as well as to insure safety of the carrier end 13. It is essential that the waste exchanging element 14 be present.

Figure 2:
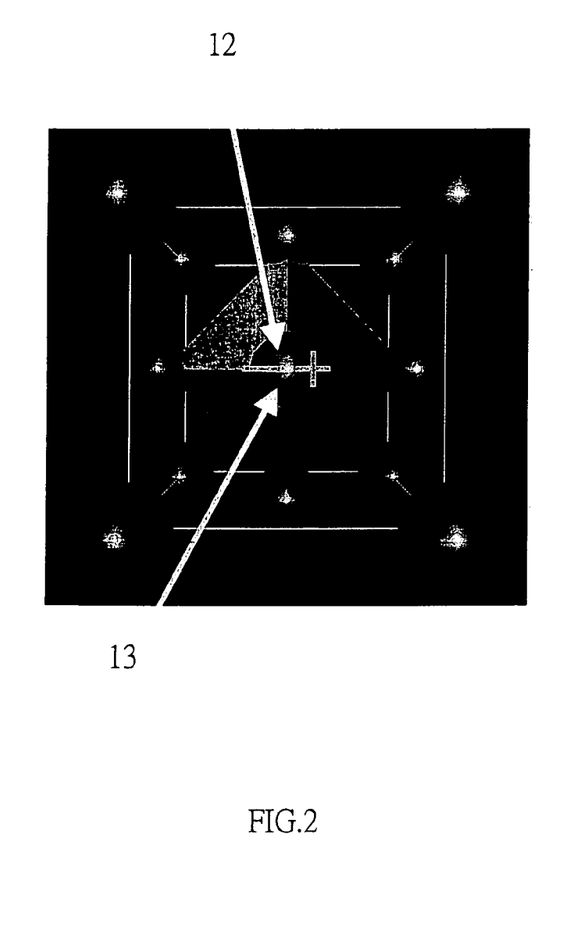
FIGS. 2 and 3 show sample structural diagrams of lattices reacting for producing potential difference.
Figure 3:
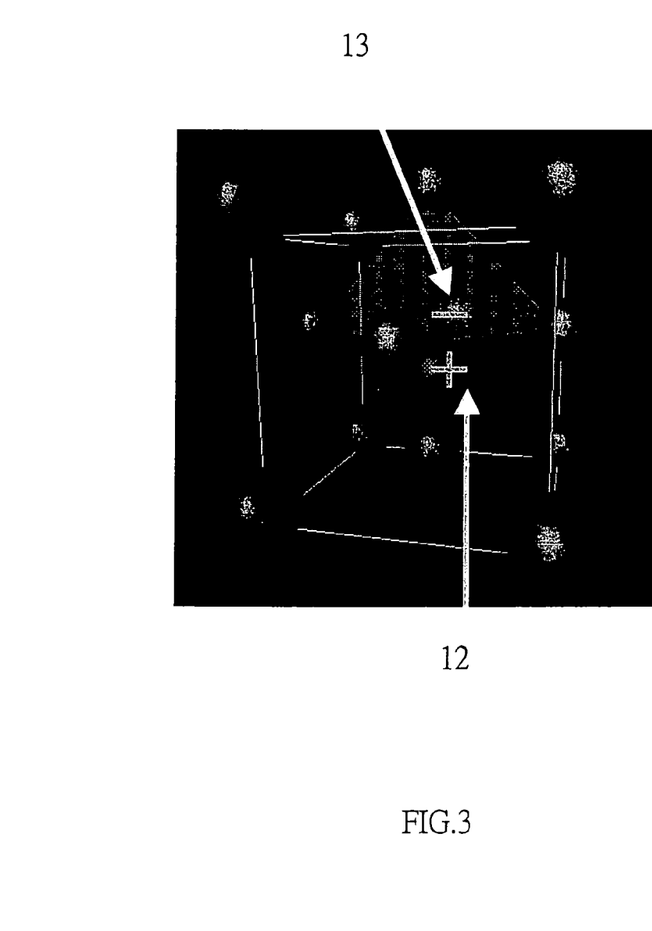

As for operating principle of the generator element 1, referring to FIGS. 2 and 3 showing reaction of lattices of the generator element 1 having accepted heat, no net charge is produced when a center of a positive charge overlaps with a center of a negative charge. Supposed reaction of lattices of the material is triggered by temperature change, the center of the positive charge is separated from the center of the negative charge, and pyroelectric conversion takes place due to potential difference produced.

FIGS. 2 and 3 are represented as simulations only. The positive charge and the negative charge are in fact clusters. In the diagrams, a position of a core of the cluster is defined as the center of the positive charge or the center of the negative charge for easier illustrations.

Apart from fundamental pyroelectric conversion capability, the invention also realizes exceptionally high energy density, which approximates 4 W/cm³. Moreover, a rather low temperature around 60° C. is adequate for achieving full-load output effects.

Figure 4:
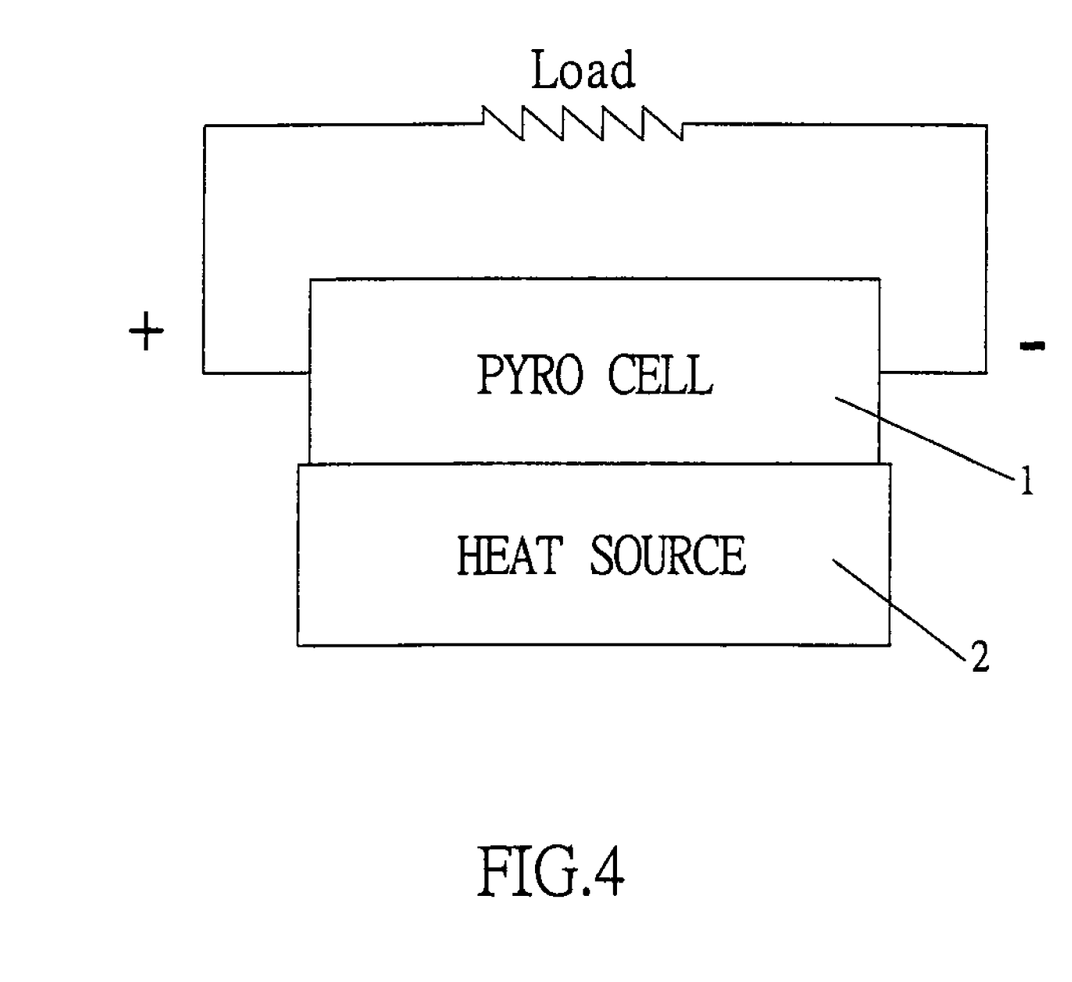
FIG. 4 shows a basic application schematic view according to the invention being heated on one side thereof.

Referring to FIG. 4 showing a basic application embodiment according to the invention, a generator element 1 is directly adhered to a radiating plane of a heat source 2, so as to generate a current by having the generator element 1 accept a constant temperature of the heat source 2.

Figure 5:
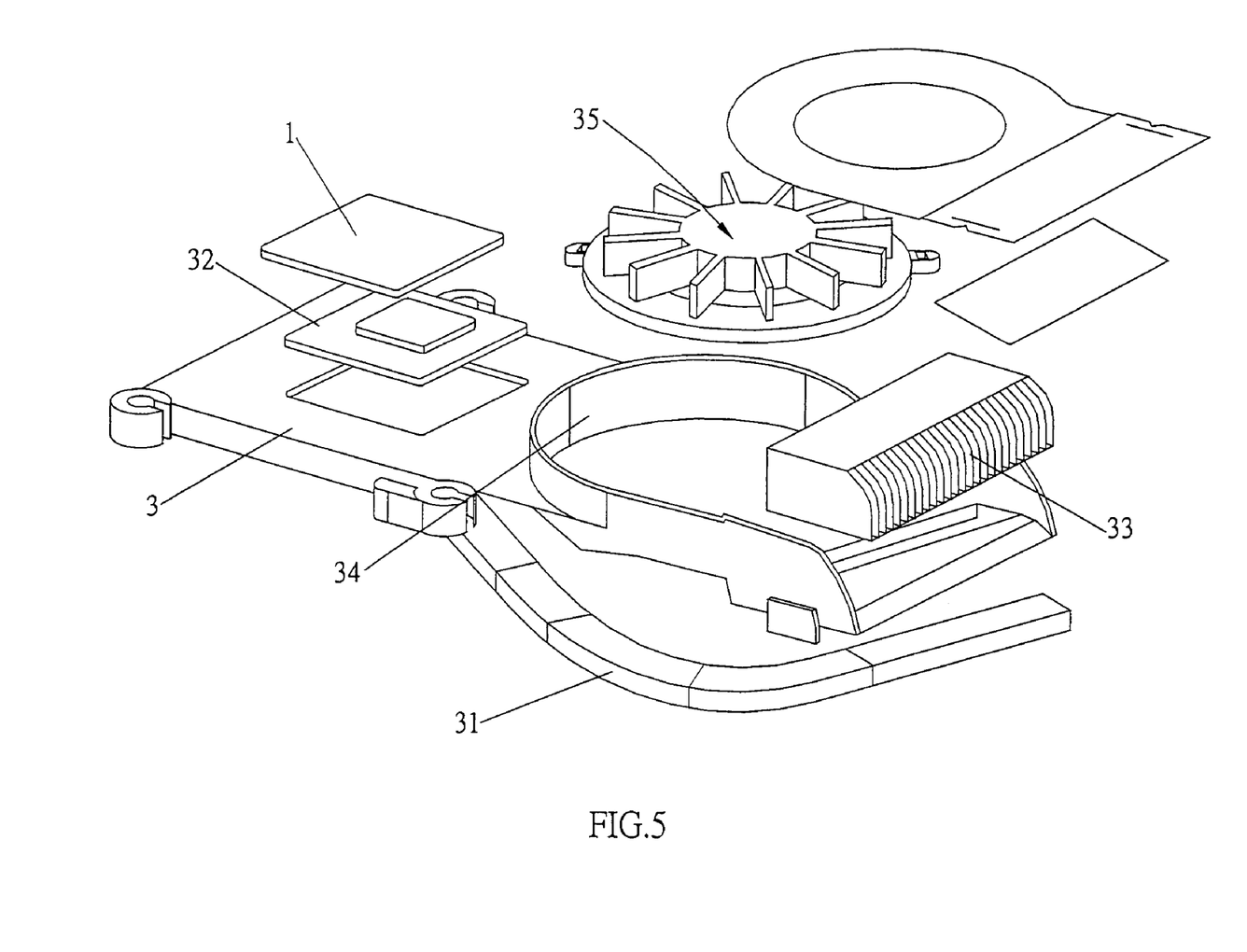
FIG. 5 shows an application embodiment according to the invention.

A pyroelectric driving heat dissipating device as shown in FIG. 5 is applied as a circuit of the invention, waste heat from a computer CPU or an adaptor is employed as pyroelectric conversion foundation that produces an electric current through pyroelectric effects. To simplify illustrations, an application of a CPU is used below. The heat dissipating device comprises a fixed base 3 that conducts heat energy via a heat conducting tube 31 at an interior thereof. Heat produced by a CPU or a chipset is guided to cooling fins 33 provided with a fan 34 at one side thereof. Using radial-flow effects of an exhaust fan 35, cold wind is brought toward the cooling fins 33 for heat dissipation. It is to be noted that electric energy used by the exhaust fan 35 is forthrightly supplied by the generator element 1. According to the invention, the generator element 1 is directly pressed against and connected to a heat-generating end of the CPU or the chipset, and hence a self-contained close loop is formed through an arrangement indicated in FIG. 4. Supposed the CPU operates at faster speeds and thus produces high temperatures, the generator element 1 is allowed with correspondingly high temperatures as well, and even greater electric energy is generated for utilization of the exhaust fan 35. Therefore, the exhaust fan 35 also performs high-speed and low-speed operations owing to changes in direct-current potential. That is, the exhaust fan 35 operates with a higher speed in the presence of high temperatures, and resultingly performs more efficient heat dissipation upon the cooling fins 33.

Figure 6:
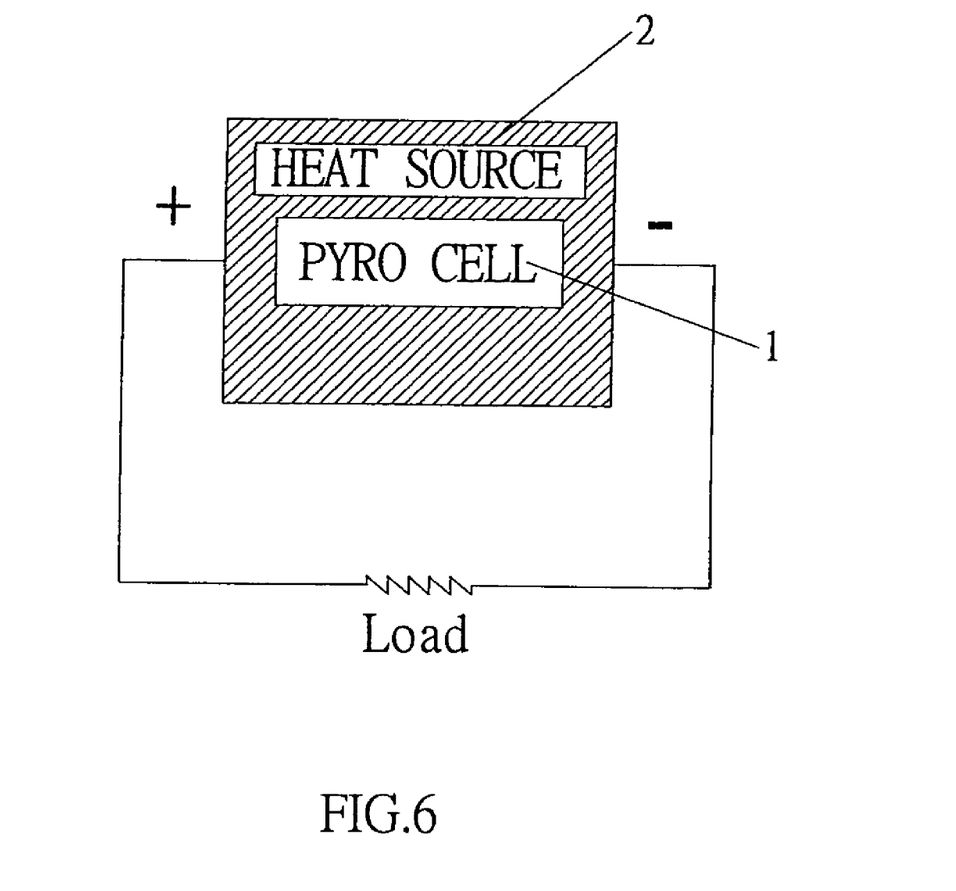
FIG. 6 shows a schematic view illustrating an application embodiment being hot-dipped according to the invention.

Referring to FIG. 6, an entire surface of the generator element 1 applied in the invention is adaptable to surrounding temperatures and can be applied using hot-dip. Without requiring heat sink effects by coolers, the generator element 1 is capable of generating electric currents by continuously accepting heat for providing electricity, and is thus applicable in any occasions having heat sources.

Figure 61:
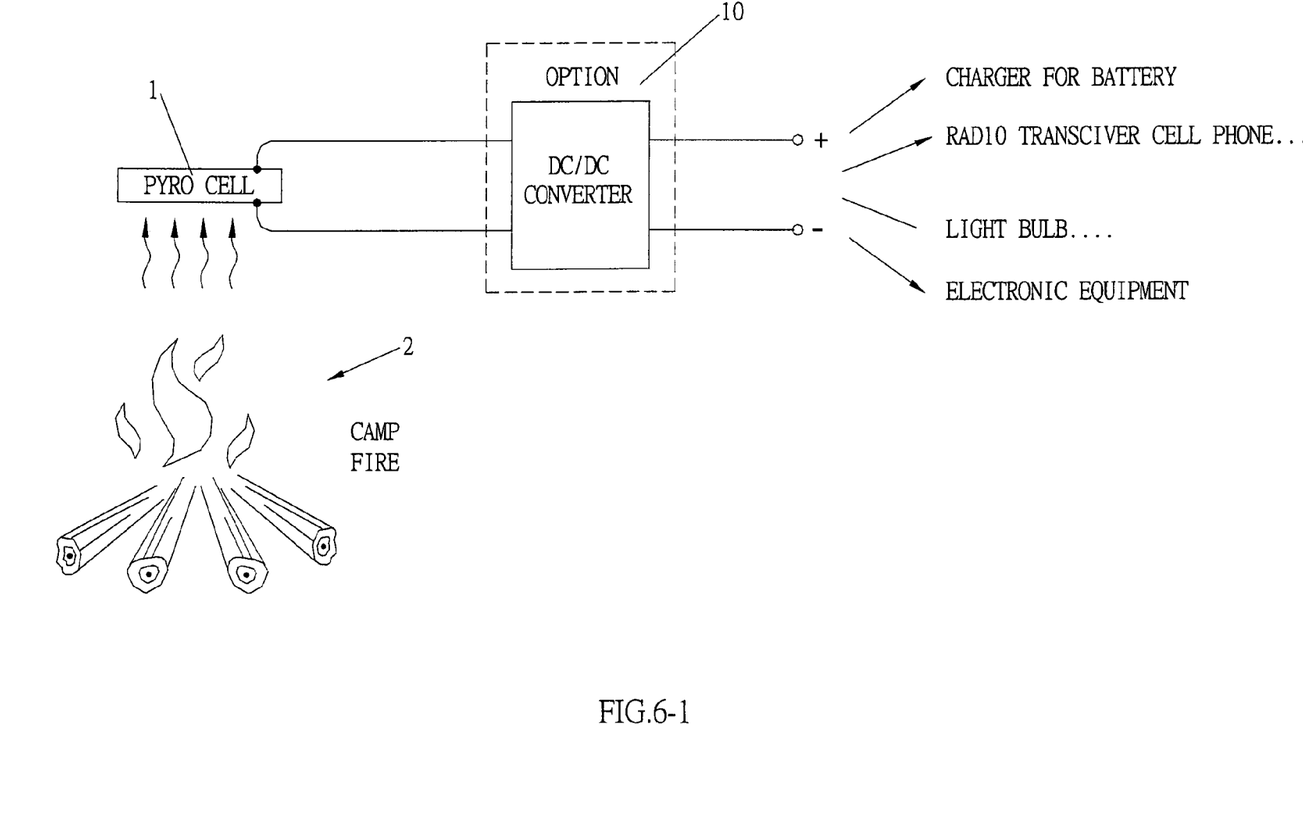

FIG. 6-1 shows another convenient application according to the invention. The generator element 1 is combined with a conversion circuit 10, and an integrated structure formed becomes a readily portable equipment. The generator element 1 is apt to attain the heat source 2 by any means, for instance, burning wood or various kinds of fuels outdoors. The heat source 2 reacts upon the generator element 1, and stable electricity is obtained through the conversion circuit 10 from electric currents produced by the generator element 1.

Figure 62:
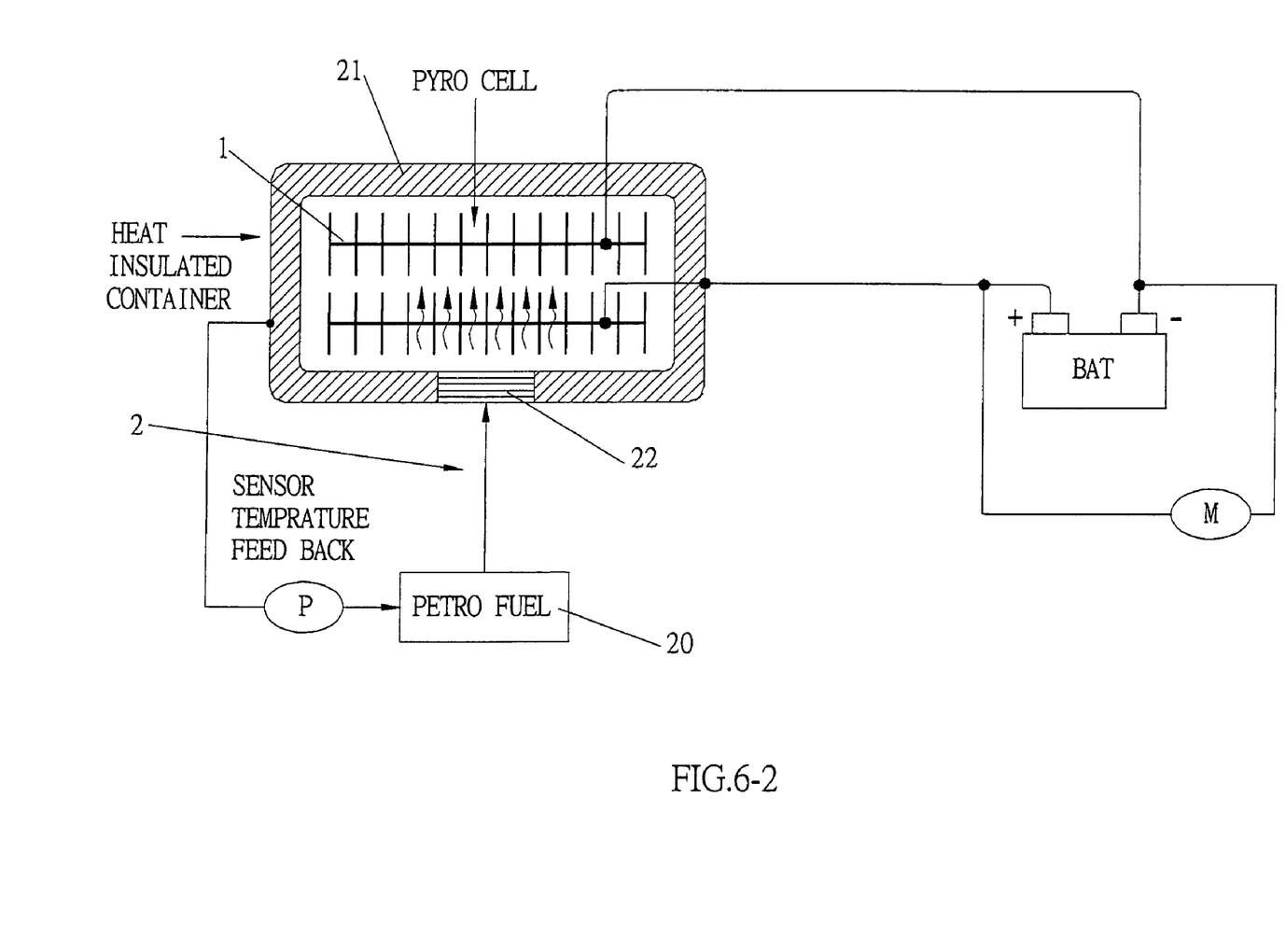

A self-contained and heat-absorbing method is further utilized for formation of the heat source 2. Referring to FIG. 6-2, a heater 20 operating on resources such as fossil fuel or gas acts upon a heat catalyst 22. Heat produced by the heat catalyst 22 is then forwarded into a heat-resistant frame body 21, and is remained therein for providing the generator element 1 with operating thermal energy. This embodiment according to the invention is applicable at temperatures below 200° C. with the heater 30 performing at efficiency around 75%. In addition, the heater 20 can intermittently heat the heat catalyst 22; for instance, the heater 20 reactivates for heating when temperature drops, or automatically becomes idle when temperature at an interior of the frame body 21 reaches about 200° C., thereby providing intermittent heating depending on temperature conditions. Consequently, using this embodiment, unnecessary resource wastage is not resulted by intrinsic quality of the heater 20, and without producing any hazardous pollutions, substantial electricity can be generated by expanding this application embodiment.

Figure 7:
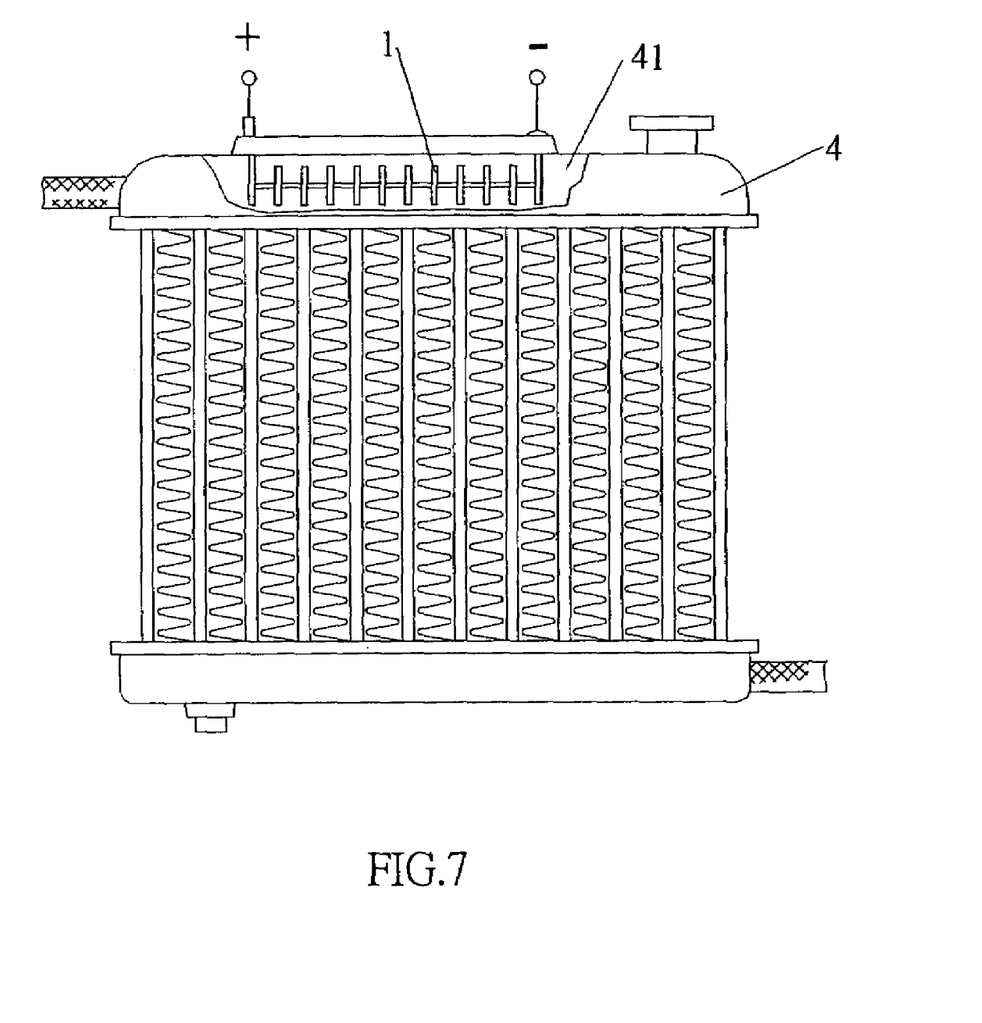
FIGS. 7, 8, 9 and 10 show schematic views illustrating application embodiments according to the invention.

FIGS. 7, 8, 9 and 10 show embodiments of related applications according to the invention. Referring to FIG. 7, a channel 41 is formed at an interior of a heat sink 4 comprising a heat flow. The channel 41 is for allowing circulation of the heat flow and is preferably provided at a position having high temperatures. The generator elements 1 are arranged in a row within the channel 41, thereby completing an application of generating electric currents by drawing pyroelectric reactions.

Figure 71:
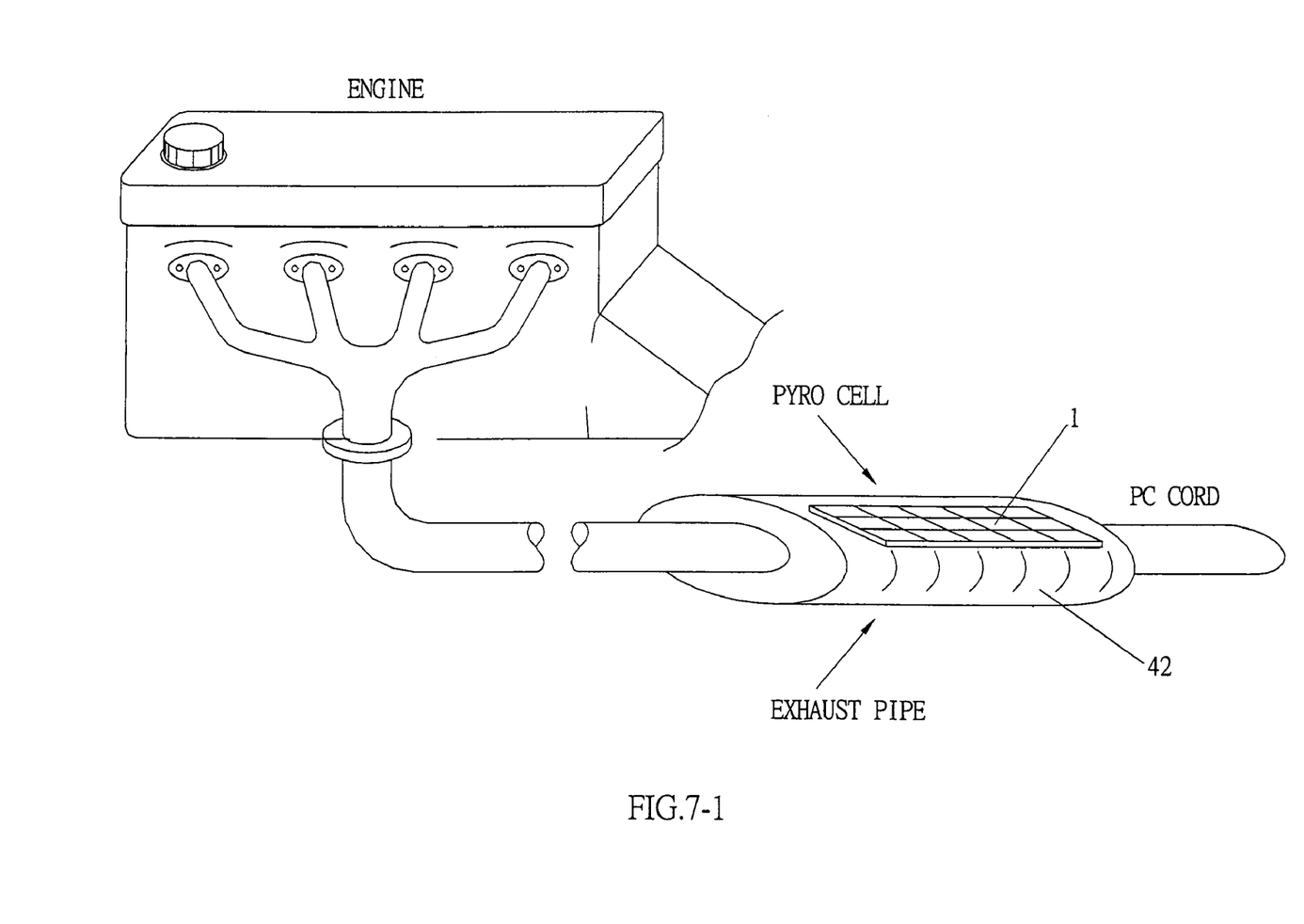

The invention may be further constructed at an exhaust pipe or a position bearing high temperatures from an engine when being applied at an exhaustion path of waste heat produced by an automobile. Referring to FIG. 7-1, a hot-air discharging device 42 is disposed with the generator element 1, which has a volume adjustable for accommodating to magnitude of electricity required. For example, when the invention is applied for charging an automobile battery, a generator element 1 having a total volume of 150 cm$^3$ is adequate for generating about 600 W of power. A common automobile battery has a specification of 12V-50A, and under normal driving circumstances, a current used is below 50A. Also, power consumption needed by an automobile engine to drive the generator approaches 1 HP, which is considered rather significant, and the generator has an efficiency of round 75%. Hence, approximately 800 W of output power from the engine is required; that is, more than 1.0724HP. As a result, fuel consumption can be evidently increased.

Using the generator element 1 applied in the invention, a volume of around 1 cm$^3$ can generate 4 W of power. Therefore, when the generator element 1 is applied for charging an automobile battery, a total volume of 150 cm$^3$ is satisfactory for accomplishing charging of the battery. Furthermore, in order to protect the battery, a common electromechanical method is employed between the generator element 1 and the battery. Because thermal energy produced by the operating the engine is uninterrupted, electric energy generated by the generator element 1 can be regarded as a loop for boosting power of spark plugs, or as a power source for operating any electricity driven devices of an automobile such as an air-conditioner motor.

Figure 8:
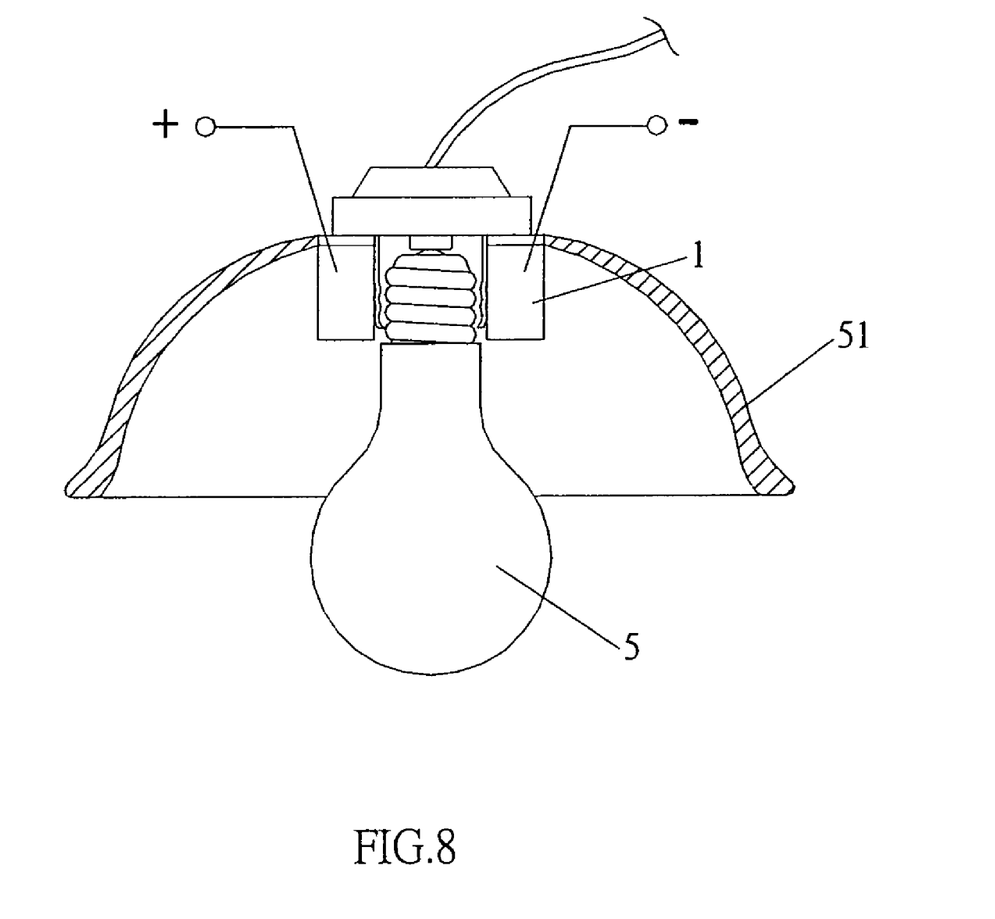

The invention yet further provides advanced and detailed applications. Referring to FIG. 8 showing a field that common thinking fails to be applied, the embodiment illustrates that wherever a heat source is present, energy collection and electric conversion become possible from the heat source. For instance, the invention can be applied at an energy-concentrated end of an incandescent light bulb 5 that produces heat. Heat energy is collected by a reflecting hood 51 and concentrated at a top portion, such that the generator element 1 disposed around the top portion becomes capable of generating electric energy by accepting heat produced by the incandescent light bulb 5 for further fulfilling other power requirement. Large lightings such as mercury lights, sodium lights and helium neon lights have about 50% operating efficiency and need more than 1 KW of power, and hence above 500 W of power is wasted. Additional considerable resources can contributed at a scene of illumination if heat sources are acquired by related lightings used.

Figure 9:
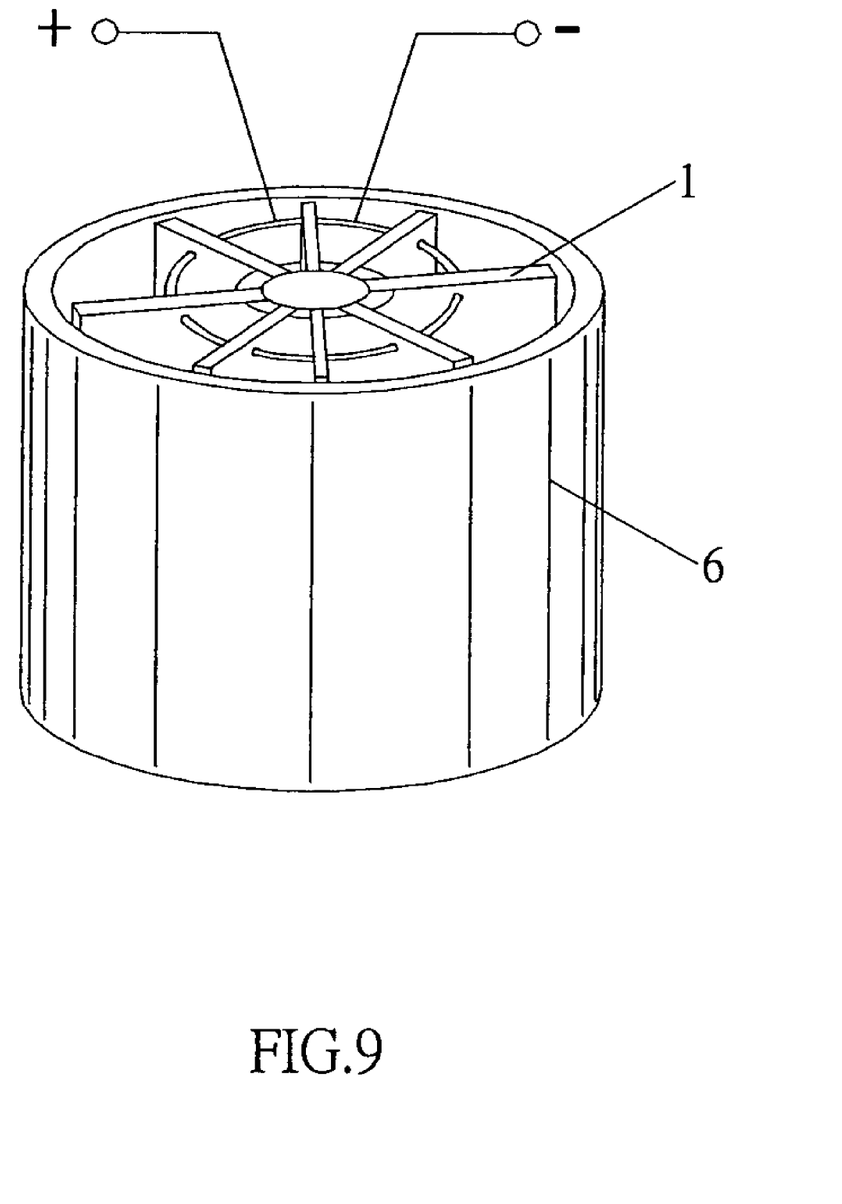
Figure 10:
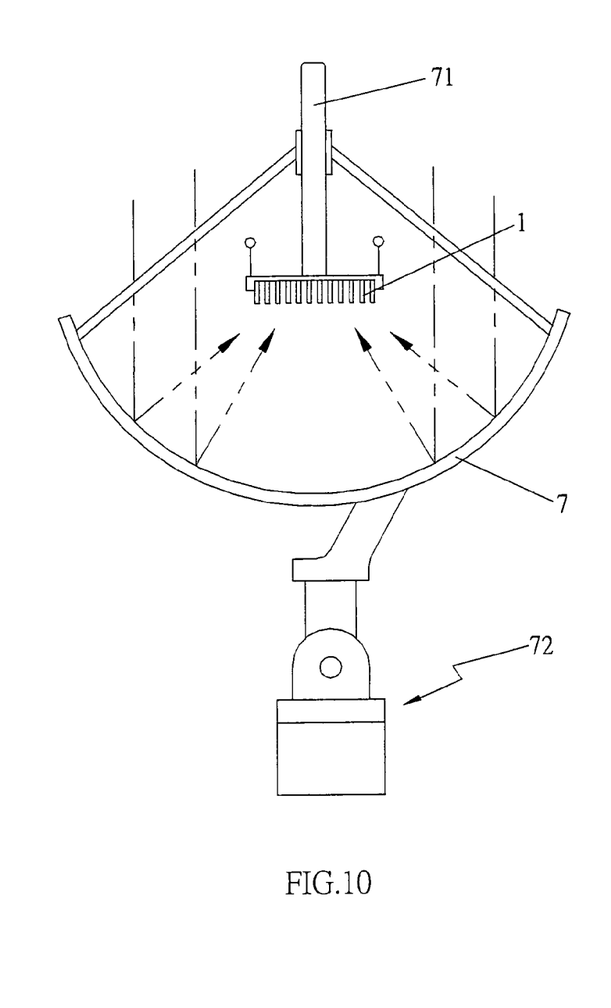

Referring to FIG. 9, an interior of a heat flow tube 6 is radially disposed with a plurality of generator elements 1. Flowing heat sources within the heat flow tube 6 are then directly accepted by the generator elements 1 for temperature raising, thereby generating electric energy.

Figure 91:
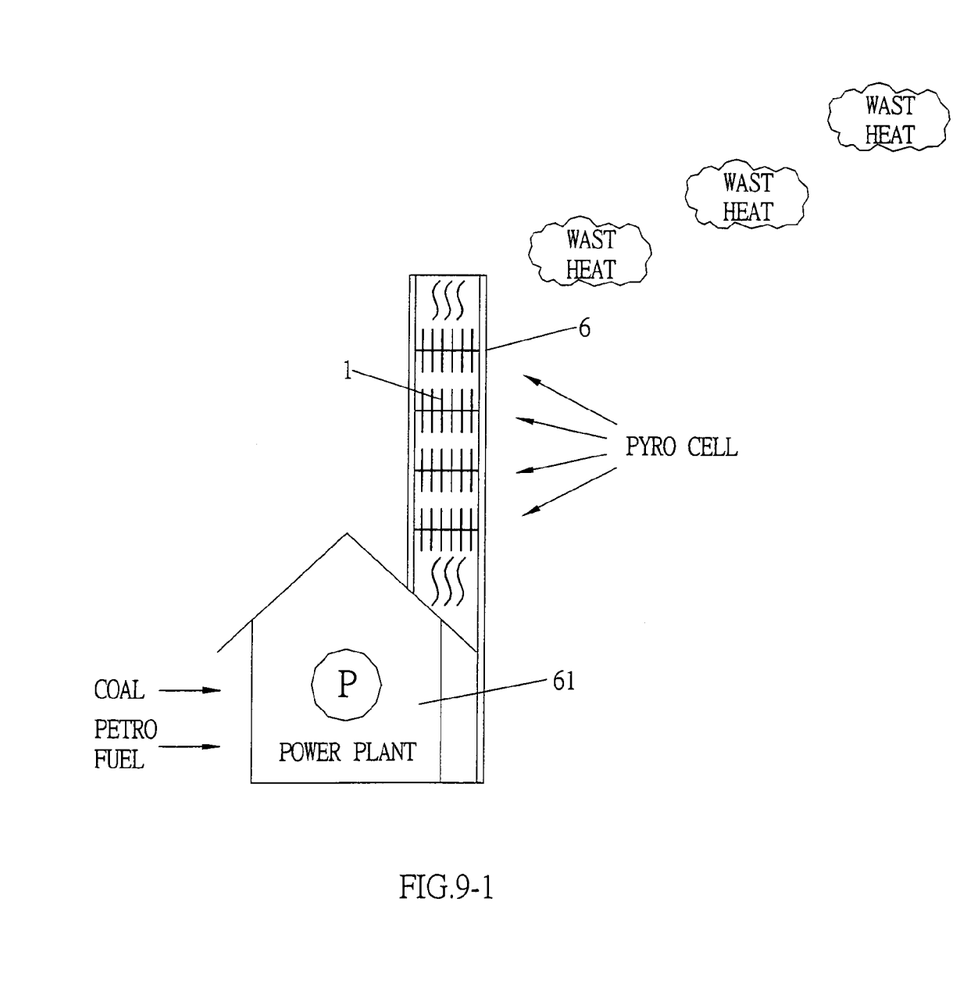

Referring to FIG. 9-1, waste heat formed by a heat workplace 61 is dissipated through the heat flow tube 6. The heat tube 6 is arranged with a plurality of generator elements 1 in advance, so as to collect heat passing through the heat flow tube 6 and to convert the heat collected into electric energy. In addition, the electric energy generated is fed back to devices in the heat workplace 61 requiring electric energy. Assume that the heat workplace 61 is a power plant, an power output end thereof can be combined with a conducting circuit of the generator element 1 for serving as an energy provider and thus elevating power utilization. In a general thermal power plant having low-temperature chimneys, the generator element 1 according to the invention with an operating temperature as low as 55° C., is the sole available design that can be applied at discharging paths of waste heat from power plants. Likewise, the application according to the invention can be expanded to any circumstances having low temperatures, 55° C., for example.

Again referring to FIG. 10, in order to gather natural surrounding temperatures in this embodiment, a reflecting dish 7 is adopted for tracking solar energy through a light source sensor 71. The reflecting dish 7 is disposed with the generator element 1 at a reflecting center thereof, and is capable of increasing concentration of solar energy by instructing a bearing adjuster 72 to maintain positioning with locations of the sun. In this embodiment, solar energy accepted is thermal radiation waves but not visible light beams from the sun. Through thermal radiation from the sun, high-efficiency heating is similarly applied to the generator element 1 for converting into same electric energy. To apt the generator element 1 to obtain thermal radiation waves of natural environments, surfaces of the generator elements 1 may be colored with black, so as to form a coating prone to absorption of thermal radiation waves for increasing efficiency of radiation absorption. Using the embodiment indicated in FIG. 10, automatic and voluntary electric generation is achievable under good weather conditions. Moreover, more intensive thermal radiation waves, or even incandescent light waves and far infrared waves can be collected using the bearing adjuster 72 targeting at locations of the solar radiation source. Certainly, the reflecting dish 7 has the function of reflecting the aforesaid thermal waves.

The invention provides a firm structure having an adjustable dimension for accommodating different occasions to be applied. The invention can be implemented from small-scale applications such as power generation of laptop computers for assisting heat dissipation of fans, to large-scale applications such as power plants, or even heating effects by accepting solar energy at outer space. Achievements of the invention are pollution-free and simple structures, which have lengthened lifespan and are non-mechanical dynamic when idle. Also, electric energy generated can be stored in electric storage devices. To be conclusive, the invention covers common and extensive applications. The structure of the invention is similar to that of precise electronic ceramics and adopts elements having good heat and electricity conductance, and a characteristic of converting thermal energy to electric energy by elements having larger potential from anisotropy displacement due to different charges of covalent ions in lattices. It shall be noted that elements conforming to the above conditions are included as an embodiment according to the invention.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. An apparatus for solid-state pyroelectric energy conversion comprising:

an electric generating element made of a pyroelectric thermal-reactive electronic ceramic material; wherein lattices of generator element components react along polar axes of the lattices, such that anisotropy displacement of centers of positive charges and centers of negative charges of covalent ions within the lattices is occurred to further result in potential difference from generating electric currents when a heat is applied to the electric generating element; wherein the electric generating element comprises positive and negative dielectric layers and the electric currents produced are drained and guided through positive and negative dielectric layers of the generator element; and a reflection disc placed opposite to the electric generating element and reflecting heat radiation toward the electric generating element.

2. The apparatus in accordance with claim 1, wherein the generator element directly absorbs from heat sources via at least one of convection, conduction and radiation to produce pyroelectric conversion effects, which are applicable for driving electricity-driven equipments and perform conversion of thermal energy to electric energy.

3. The apparatus in accordance wit claim 1, further comprising a conversion circuit to output the electric currents.

4. The apparatus in accordance with claim 1, wherein the generator element is heated by accepting radiation from the sun.

5. The apparatus in accordance with claim 1, further comprising an exhaust fan driven by the electrical current to provide heat dissipation effect.

* * * * *